US012666542B2

(12) United States Patent
Xu et al.

(10) Patent No.: US 12,666,542 B2
(45) Date of Patent: Jun. 23, 2026

(54) POWER COMPONENT SUBMOUNT AND MANUFACTURING METHOD THEREOF

(71) Applicant: TONG HSING ELECTRONIC INDUSTRIES, LTD., Taoyuan City (TW)

(72) Inventors: Jia-Zheng Xu, Taoyuan City (TW); Jhih-Wei Lai, Taoyuan City (TW); Chun-Chieh Liao, Taoyuan City (TW); Jian-Yu Shih, Taoyuan City (TW); Ming-Yen Pan, Taoyuan City (TW)

(73) Assignee: TONG HSING ELECTRONIC INDUSTRIES, LTD., Taoyuan City (TW)

( * ) Notice: Subject to any disclaimer, the term of this patent is extended or adjusted under 35 U.S.C. 154(b) by 7 days.

(21) Appl. No.: 18/773,523

(22) Filed: Jul. 15, 2024

(65) Prior Publication Data

US 2025/0142730 A1     May 1, 2025

Related U.S. Application Data

(60) Provisional application No. 63/546,411, filed on Oct. 30, 2023.

(30) Foreign Application Priority Data

Mar. 14, 2024    (TW) ................................. 113109342

(51) Int. Cl.
*H05K 3/18*          (2006.01)
*C23C 14/18*       (2006.01)
(Continued)

(52) U.S. Cl.
CPC ........... *H05K 3/188* (2013.01); *C23C 14/185* (2013.01); *C23C 14/5873* (2013.01); (Continued)

(58) Field of Classification Search
None
See application file for complete search history.

(56) References Cited

U.S. PATENT DOCUMENTS 4,016,050 A * 4/1977 Lesh, deceased ....... H01B 1/00
                                                                  205/186
6,784,543 B2 * 8/2004 Matsuki ................. H05K 3/244
                                                                  257/772
(Continued)

*Primary Examiner* — Seth Dumbris
(74) *Attorney, Agent, or Firm* — Li & Cai Intellectual Property Office

(57) ABSTRACT

A power component submount includes a ceramic substrate, a sputtering layer formed on the ceramic substrate, a conductive block formed on the sputtering layer, and three electroless plating layers that are sequentially stacked on the conductive block. The sputtering layer includes an electroplating portion. The conductive block is formed on the electroplating portion, and bottoms of the three electroless plating layers are connected to the ceramic substrate. Materials of the three electroless plating layers are gold, palladium, and gold, respectively; or, materials of the three electroless plating layers are nickel, palladium, and gold, respectively. One of the three electroless plating layers arranged away from the conductive block is provided for allowing a power component to be mounted thereon.

6 Claims, 11 Drawing Sheets

(51) Int. Cl.

| | |
|---|---|
| *C23C 14/58* | (2006.01) |
| *C23C 18/16* | (2006.01) |
| *C23C 18/32* | (2006.01) |
| *C23C 18/42* | (2006.01) |
| *C23C 28/02* | (2006.01) |
| *C25D 5/02* | (2006.01) |
| *C25D 5/54* | (2006.01) |
| *H05K 1/03* | (2006.01) |

(52) U.S. Cl.

CPC ...... *C23C 18/1639* (2013.01); *C23C 18/1651* (2013.01); *C23C 18/1653* (2013.01); *C23C 18/32* (2013.01); *C23C 18/42* (2013.01); *C23C 28/023* (2013.01); *C25D 5/022* (2013.01); *C25D 5/54* (2013.01); *H05K 1/0306* (2013.01); *H05K 3/181* (2013.01)

(56) References Cited

U.S. PATENT DOCUMENTS

| | | | | |
|---|---|---|---|---|
| 2008/0258299 A1* | 10/2008 | Kang | ...................... | H01L 24/29 |
| | | | | 257/737 |
| 2010/0071940 A1* | 3/2010 | Ejiri | ...................... | H01L 21/561 |
| | | | | 174/257 |
| 2012/0068218 A1* | 3/2012 | Chang | ................ | H10H 20/8582 |
| | | | | 257/E33.056 |
| 2012/0298413 A1* | 11/2012 | Mori | .................... | H01L 23/147 |
| | | | | 29/829 |
| 2013/0003332 A1* | 1/2013 | Lee | ........................ | H05K 3/181 |
| | | | | 174/257 |
| 2017/0359891 A1* | 12/2017 | Gozu | ................ | H01L 23/49822 |
| 2024/0112979 A1* | 4/2024 | Hung | .................... | H01L 23/498 |

* cited by examiner

1

POWER COMPONENT SUBMOUNT AND MANUFACTURING METHOD THEREOF

CROSS-REFERENCE TO RELATED PATENT APPLICATION

This application claims the benefit of priority to Taiwan Patent Application No. 113109342, filed on Mar. 14, 2024. The entire content of the above identified application is incorporated herein by reference.

This application claims the benefit of priority to the U.S. Provisional Patent Application Ser. No. 63/546,411, filed on Oct. 30, 2023, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a submount, and more particularly to a power component submount and a manufacturing method thereof.

BACKGROUND OF THE DISCLOSURE

In a manufacturing process of a conventional power component submount, conductors are only formed in an electroplating manner, such that tie bars need to be formed in order to connect the conductors. Accordingly, after the conductors are completely formed, the tie bars are sliced to separate the conductors from each other, but the sliced tie bars easily cause burrs to be formed on the conventional power component submount.

SUMMARY OF THE DISCLOSURE

In response to the above-referenced technical inadequacies, the present disclosure provides a power component submount and a manufacturing method thereof for effectively improving on the issues associated with conventional power component submounts.

In order to solve the above-mentioned problems, one of the technical aspects adopted by the present disclosure is to provide a manufacturing method of a power component submount. The manufacturing method includes a sputtering step, a patterning step, an electroplating step, a removing step, and an electroless plating step. The sputtering step is implemented by sputtering a board surface of a ceramic substrate to form a sputtering layer. The patterning step is implemented by forming an insulating layer on the sputtering layer. Moreover, a part of the sputtering layer and the insulating layer jointly define an electroplating slot, and the part of the sputtering layer is defined as an electroplating portion. The electroplating step is implemented by electroplating the electroplating portion of the sputtering layer to form a conductive block in the electroplating slot. The removing step is implemented by removing the insulating layer and another part of the sputtering layer. The electroplating portion of the sputtering layer is not removed. The electroless plating step is implemented by performing an electroless plating process on the conductive block to sequentially form a first electroless plating layer, a second electroless plating layer, and a third electroless plating layer. The first electroless plating layer is connected to the ceramic substrate and covers the conductive block and the electroplating portion. The second electroless plating layer is connected to the ceramic substrate and covers the first electroless plating layer. The third electroless plating layer is connected to the ceramic substrate and covers the second electroless plating layer. The first electroless plating layer is made of gold (Au) or nickel (Ni), the second electroless plating layer is made of palladium (Pd), and the third electroless plating layer is made of gold (Au) and is configured to provide for a power component to be assembled thereon.

In order to solve the above-mentioned problems, another one of the technical aspects adopted by the present disclosure is to provide a power component submount, which includes a ceramic substrate, a sputtering layer, a conductive block, a first electroless plating layer, a second electroless plating layer, and a third electroless plating layer. The sputtering layer is formed on a board surface of the ceramic substrate and includes an electroplating portion. The conductive block is formed on the electroplating portion. The first electroless plating layer covers the conductive block and the electroplating portion, a bottom of the first electroless plating layer is connected to the ceramic substrate, and the first electroless plating layer is made of gold (Au) or nickel (Ni). The second electroless plating layer covers the first electroless plating layer, a bottom of the second electroless plating layer is connected to the ceramic substrate, and the second electroless plating layer is made of palladium (Pd). The third electroless plating layer covers the second electroless plating layer, a bottom of the third electroless plating layer is connected to the ceramic substrate, and the third electroless plating layer is made of gold (Au) and is configured to provide for a power component to be assembled thereon.

In order to solve the above-mentioned problems, yet another one of the technical aspects adopted by the present disclosure is to provide a manufacturing method of a power component submount. The manufacturing method includes a sputtering step, an electroplating step, a covering step, a patterning step, and a first electroless plating step. The sputtering step is implemented by sputtering two board surfaces of a ceramic substrate to form a plurality of electroplating portions. The electroplating step is implemented by electroplating the electroplating portions to form a plurality of conductive blocks on the electroplating portions, respectively. The covering step is implemented by forming two insulating layers on the two board surfaces of the ceramic substrate, respectively. The conductive blocks are embedded in the two insulating layers. The patterning step is implemented by forming a plurality of electroless plating slots in the two insulating layers. Each of the electroless plating slots is formed to enable one of the conductive blocks to be exposed therefrom. The first electroless plating step is implemented by performing an electroless plating process on the electroless plating slots to form a plurality of first electroless plating conductors in the electroless plating slots, respectively. Each of the first electroless plating conductors includes a first electroless plating layer connected to a corresponding one of the conductive blocks, a second electroless plating layer connected to the first electroless plating layer, and a third electroless plating layer that is connected to the second electroless plating layer.

In each of the first electroless plating conductors, the first electroless plating layer is made of gold (Au) or nickel (Ni), the second electroless plating layer is made of palladium (Pd), and the third electroless plating layer is made of gold (Au).

In order to solve the above-mentioned problems, still another one of the technical aspects adopted by the present disclosure is to provide a power component submount, which includes a ceramic substrate, a sputtering layer, a plurality of conductive blocks, two insulting layers, and a plurality of first electroless plating conductors. The ceramic substrate has two board surfaces respectively arranged on two opposite sides thereof. The sputtering layer includes a plurality of electroplating portions respectively formed on the two board surfaces. The conductive blocks are respectively formed on the electroplating portions. The two insulting layers are respectively formed on the two board surfaces of the ceramic substrate. The conductive blocks are embedded in the two insulating layers. The two insulating layers have a plurality of electroless plating slots, and each of the electroless plating slots is formed to enable one of the conductive blocks to be exposed therefrom. The first electroless plating conductors are respectively formed in the electroless plating slots, and each of the first electroless plating conductors includes a first electroless plating layer, a second electroless plating layer, and a third electroless plating layer. The first electroless plating layer is connected to a corresponding one of the conductive blocks and is made of gold (Au) or nickel (Ni). The second electroless plating layer is connected to the first electroless plating layer and is made of palladium (Pd). The third electroless plating layer is connected to the second electroless plating layer and is made of gold (Au).

Therefore, the power component submount and the manufacturing method thereof in the present disclosure are provided with a conductive structure that allows the power component to be assembled thereon, and the first electroless plating layer, the second electroless plating layer, and the third electroless plating layer of the conductive structure and the conductive block can be independently formed without use of any tie bar, thereby effectively preventing the power component submount from generating any burr.

Moreover, the power component submount and the manufacturing method thereof in the present disclosure are provided with the first electroless conductors, and the first electroless conductors can be independently formed without use of any tie bar, thereby effectively preventing the power component submount from generating any burr.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
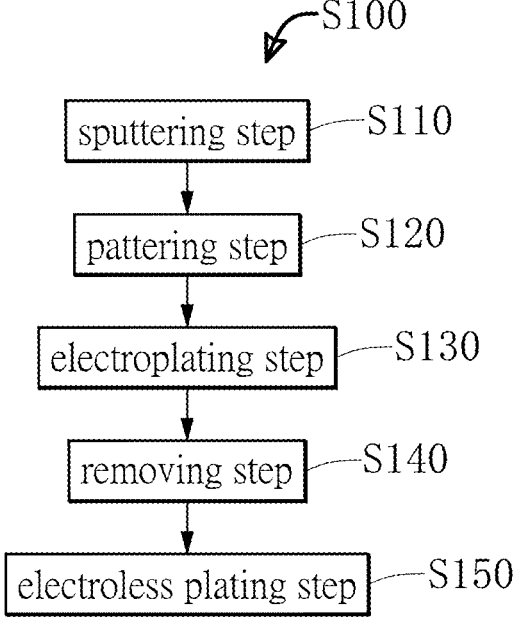
FIG. 1 is a flowchart of a manufacturing method of a power component submount according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 5, a first embodiment of the present disclosure is provided. The present embodiment provides a power component submount 100 and a manufacturing method S100 thereof. In order to clearly describe the present embodiment, the following description describes the manufacturing method S100, and then describes the structure and connection relationship of each component of the power component submount 100.

The manufacturing method S100 in the present embodiment sequentially includes (or implements) a sputtering step S110, a patterning step S120, an electroplating step S130, a removing step S140, and an electroless plating step S150. The above steps S110-S150 of the manufacturing method S100 are sequentially described in the following description and can be implemented to form the power component submount 100, but the present disclosure is not limited thereto.

For example, in other embodiments of the present disclosure not shown in the drawings, the above steps S110-S150 of the manufacturing method S100 can be added, omitted, or adjusted according to design requirements; or, the power component submount 100 can be provided by implementing methods other than the manufacturing method S100.

Figure 2:
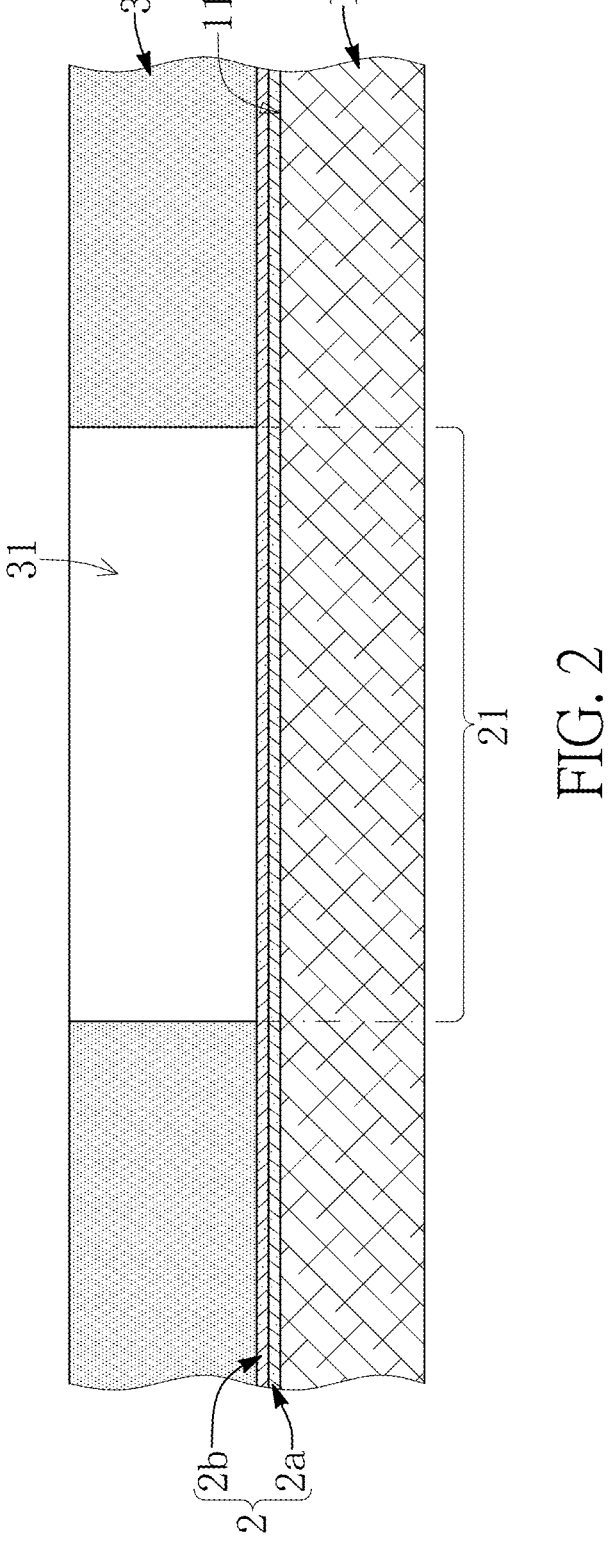
FIG. 2 is a schematic view showing a sputtering step and a patterning step of FIG. 1.

As shown in FIG. 1 and FIG. 2, the sputtering step S110 is implemented by sputtering a board surface 11 of a ceramic substrate 1 to form a sputtering layer 2. It should be noted that the sputtering layer 2 in the present embodiment includes a Ti-sputtering layer 2a (i.e., a titanium-sputtering layer 2a) covering the board surface 11 and a Cu-sputtering layer 2b (i.e., a copper-sputtering layer 2b) that covers the Ti-sputtering layer 2a, but the present disclosure is not limited thereto.

As shown in FIG. 1 and FIG. 2, the patterning step S120 is implemented by forming an insulating layer 3 on the sputtering layer 2. Specifically, a part of the sputtering layer 2 and the insulating layer 3 jointly define an electroplating slot 31. Moreover, the part of the sputtering layer 2 is defined as an electroplating portion 21. In the present embodiment, the insulating layer 3 is formed on the Cu-sputtering layer 2b, and the depth and the shape of the electroplating slot 31 can be adjusted or changed according to practical requirements, but the present disclosure is not limited thereto.

Figure 3:
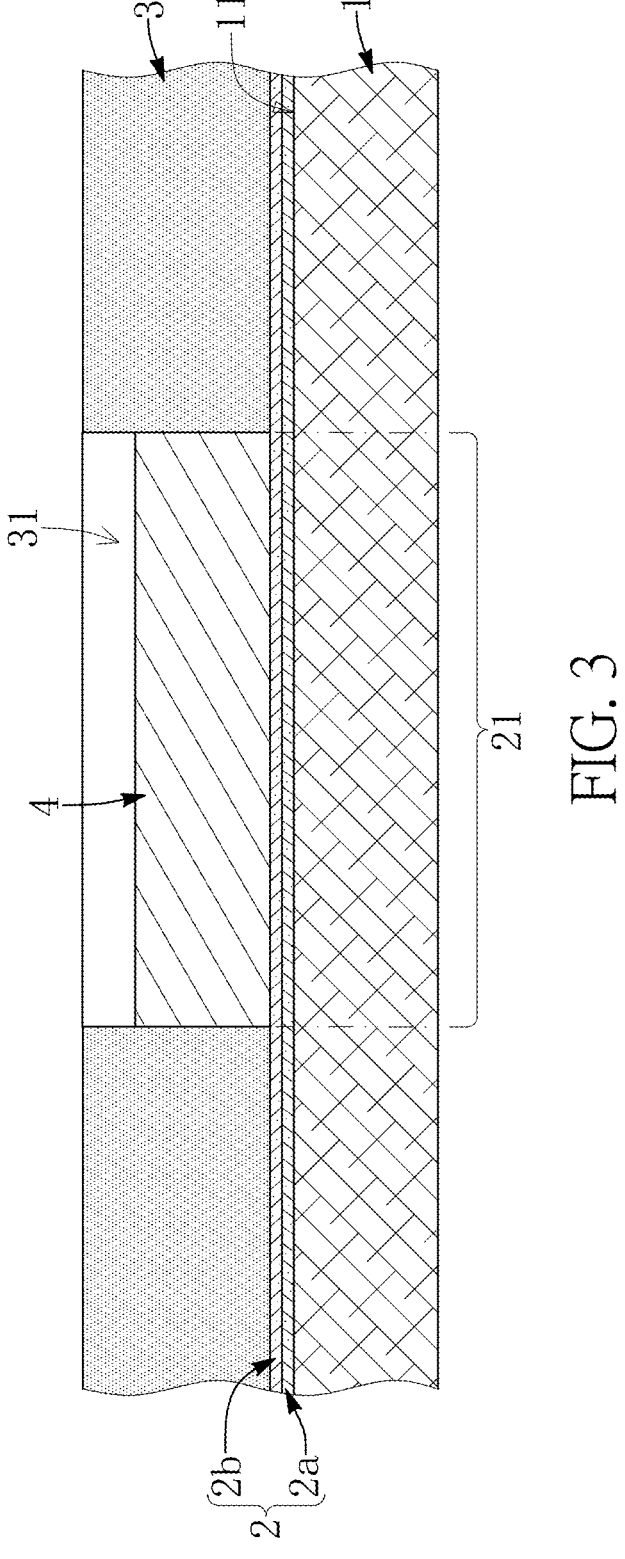
FIG. 3 is a schematic view showing an electroplating step of FIG. 1.

As shown in FIG. 1 and FIG. 3, the electroplating step S130 is implemented by electroplating the electroplating portion 21 of the sputtering layer 2 to form a conductive block 4 in the electroplating slot 31. In the present embodiment, the shape of the conductive block 4 is identical to the shape of the electroplating slot 31, and the conductive block 4 is preferably made of copper (Cu).

Figure 4:
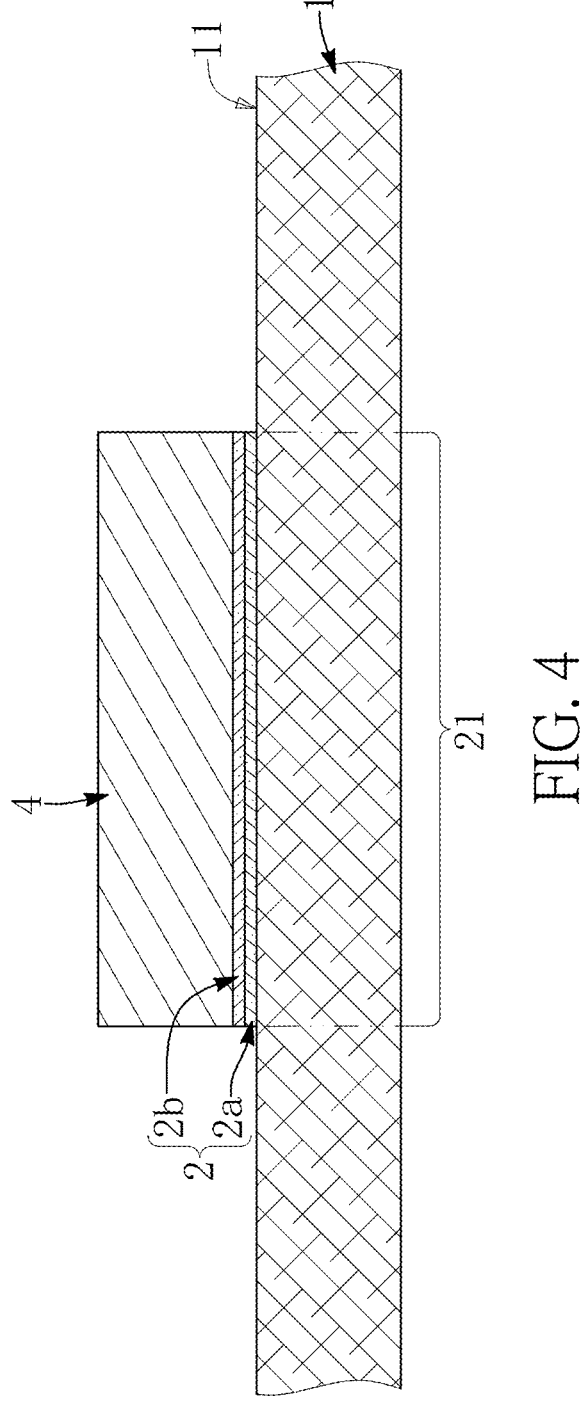
FIG. 4 is a schematic view showing a removing step of FIG. 1.

As shown in FIG. 1 and FIG. 4, the removing step S140 is implemented by removing the insulating layer 3 and another part of the sputtering layer 2, such that the electroplating portion 21 of the sputtering layer 2 is not removed.

Figure 5:
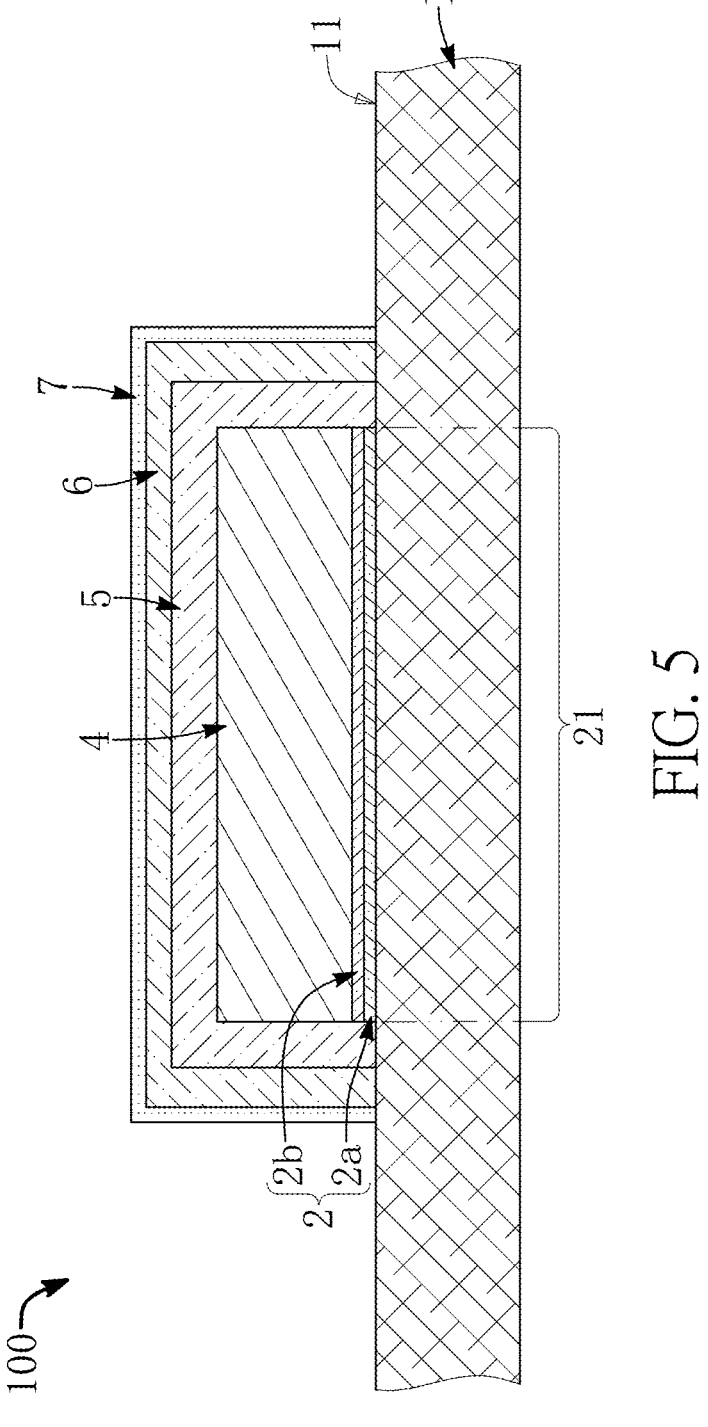
FIG. 5 is a schematic view showing an electroless plating step of FIG. 1.

As shown in FIG. 1 and FIG. 5, the electroless plating step S150 is implemented by performing an electroless plating process on the conductive block 4 to sequentially form a first electroless plating layer 5, a second electroless plating layer 6, and a third electroless plating layer 7. Specifically, the first electroless plating layer 5 is connected to the ceramic substrate 1 and covers the conductive block 4 and the electroplating portion 21, the second electroless plating layer 6 is connected to the ceramic substrate 1 and covers the first electroless plating layer 5, and the third electroless plating layer 7 is connected to the ceramic substrate 1 and covers the second electroless plating layer 6. Moreover, the first electroless plating layer 5 is made of gold (Au) or nickel (Ni), the second electroless plating layer 6 is made of palladium (Pd), and the third electroless plating layer 7 is made of gold (Au) and is configured to provide for a power component (e.g., a laser emitter not shown in the drawings) to be assembled thereon.

Accordingly, conductive structure in the present embodiment for allowing the power component to be assembled thereon is manufactured by implementing the electroless plating step S150 of the manufacturing method S100, so that the first electroless plating layer 5, the second electroless plating layer 6, and the third electroless plating layer 7 of the conductive structure and the conductive block 4 can be independently formed without using any tie bar, thereby effectively preventing the power component submount 100 from generating any burr.

In other embodiments of the present disclosure not shown in the drawings, when the manufacturing method S100 is implemented to form a plurality of electroplating portions 21 on the ceramic substrate 1 and a plurality of conductive blocks 4 that are respectively formed on the electroplating portions 21, each of the conductive blocks 4 in the electroless plating step S150 is formed with the first electroless plating layer 5, the second electroless plating layer 6, and the third electroless plating layer 7, and any two of the conductive blocks 4 are electrically isolated from each other for allowing no tie bar to be connected thereto.

It should be noted that when the first electroless plating layer 5 is limited to being made of nickel (Ni), a thickness of the first electroless plating layer 5 is greater than a thickness of the second electroless plating layer 6, and the thickness of the second electroless plating layer 6 is greater than a thickness of the third electroless plating layer 7. Specifically, in the electroless plating step S150, the first electroless plating layer 5 undergoes an immersion plating process for 1 minute in an environment of 80° C. so as to have the thickness within a range from 0.15 μm to 0.25 μm. After the first electroless plating layer 5 is formed, the second electroless plating layer 6 is manufactured in an immersion plating process by 12 minutes under an environment of 50° C. so as to have the thickness within a range from 0.08 μm to 0.12 μm. After the second electroless plating layer 6 is formed, the third electroless plating layer 7 undergoes an immersion plating process for 5 minutes in an environment of 80° C. so as to have the thickness within a range from 0.05 μm to 0.07 μm.

In summary, the above description describes a preferable implementation of the manufacturing method S100, and the following description substantially describes the power component submount 100 prepared by implementing the manufacturing method S100. In other words, features of the power component submount 100 can be referred to in the manufacturing method S100 described in the above description, but the present disclosure is not limited thereto.

As shown in FIG. 5, the power component submount 100 includes a ceramic substrate 1, a sputtering layer 2 formed on a board surface 11 of the ceramic substrate 1, a conductive block 4 formed on the sputtering layer 2, a first electroless plating layer 5 covering the conductive block 4, a second electroless plating layer 6 covering the first electroless plating layer 5, and a third electroless plating layer 7 that covers the second electroless plating layer 6.

Specifically, the sputtering layer 2 includes an electroplating portion 21. The conductive block 4 is formed on the electroplating portion 21. Moreover, a bottom of the first electroless plating layer 5, a bottom of the second electroless plating layer 6, and a bottom of the third electroless plating layer 7 are connected to the board surface 11 of the ceramic substrate 1.

In other words, the sputtering layer 2 includes a Ti-sputtering layer 2a covering the board surface 11 and a Cu-sputtering layer 2b that covers the Ti-sputtering layer 2a. The conductive block 4 is made of copper (Cu), the conductive block 4 is electrically coupled to the Cu-sputtering layer 2b, and the first electroless plating layer 5 is connected to a lateral edge of the Ti-sputtering layer 2a and a lateral edge of the Cu-sputtering layer 2b.

In addition, the first electroless plating layer 5 is made of gold (Au) or nickel (Ni), the second electroless plating layer 6 is made of palladium (Pd), and the third electroless plating layer 7 is made of gold (Au) and is configured to provide for a power component (e.g., a laser emitter not shown in the drawings) to be assembled thereon. When the first electroless plating layer 5 is made of nickel (Ni), a thickness (e.g., 0.2 μm) of the first electroless plating layer 5 is greater than a thickness (e.g., 0.1 μm) of the second electroless plating layer 6, and the thickness (e.g., 0.1 μm) of the second electroless plating layer 6 is greater than a thickness (e.g., 0.06 μm) of the third electroless plating layer 7, but the present disclosure is not limited thereto.

Second Embodiment

Figure 6:
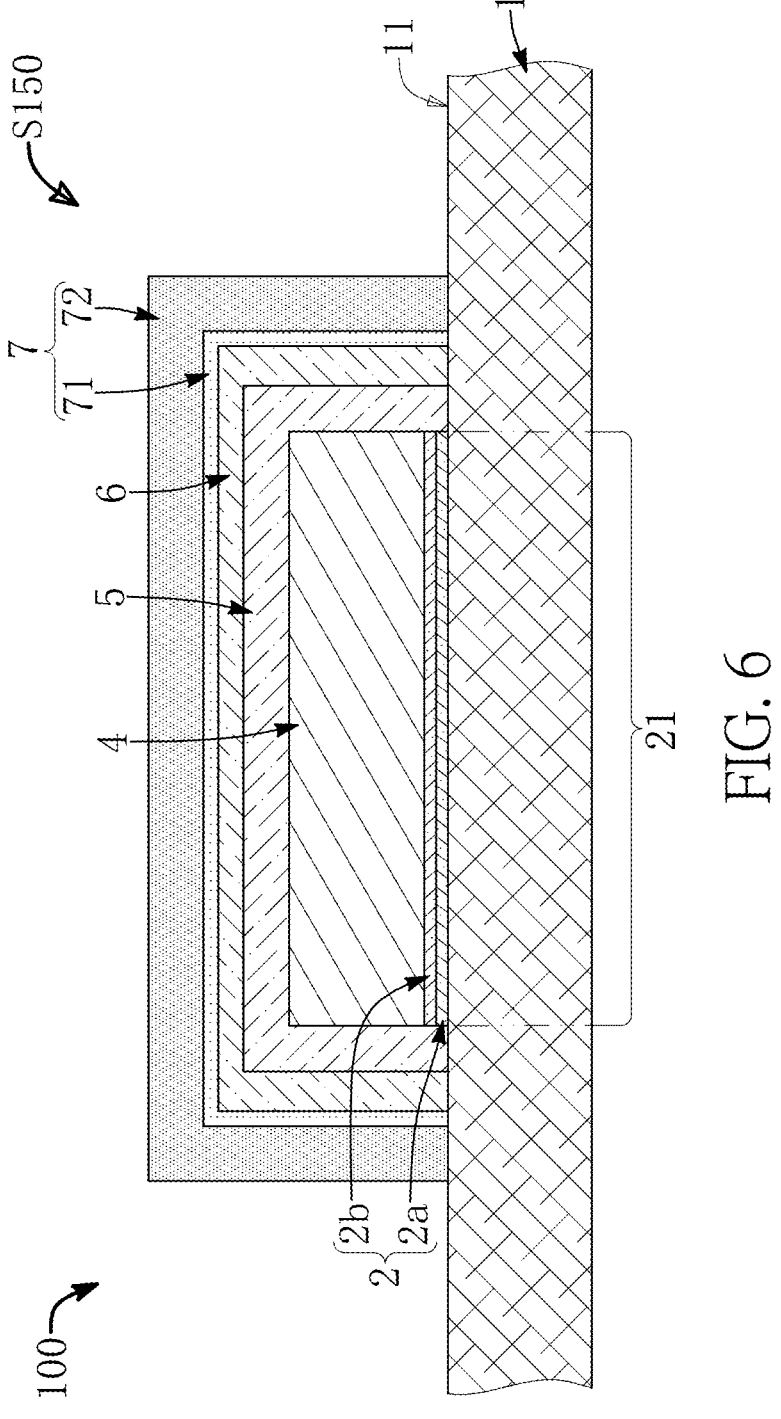
FIG. 6 is a schematic view of the power component submount according to a second embodiment of the present disclosure.

Referring to FIG. 6, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In forming of the third electroless plating layer 7 of the electroless plating step S150 provided by the present embodiment, a thin gold layer 71 is formed on the second electroless plating layer 6 in an immersion gold plating manner, and then a thick gold layer 72 is formed on the thin gold layer 71 in an auto-catalytic gold plating manner. Moreover, a thickness of the thick gold layer 72 is within a range from 400% to 600% of a thickness of the thin gold layer 71. In other words, the third electroless plating layer 7 includes the thin gold layer 71 covering the second electroless plating layer 6 and the thick gold layer 72 that covers the thin gold layer 71.

In addition, the thickness of the thick gold layer 72 is substantially equal to a sum of the thickness of the first electroless plating layer 5 and the thickness of the second electroless plating layer 6. In other words, a total thickness of the third electroless plating layer 7 in the present embodiment is greater than the sum of thickness of the first electroless plating layer 5 and the thickness of the second electroless plating layer 6, but the present disclosure is not limited thereto.

Specifically, after the second electroless plating layer 6 is formed, the thin gold layer 71 undergoes an immersion plating process for 5 minutes in an environment of 80° C. so as to have the thickness within a range from 0.05 μm to 0.07 μm. After the thin gold layer 71 is formed, the thick gold layer 72 undergoes an immersion plating process for 10 minutes in an environment of 50° C. so as to have the thickness within a range from 0.2 μm to 0.4 μm.

Moreover, the auto-catalytic gold plating manner in the present embodiment is implemented by using the thin gold layer 71 to be a catalyst, using a reducing agent to release electrons through oxidation (e.g., $R \rightarrow R'+2H^{+}+2e^{-}$), and then using a gold sulfite to receive the electrons so as to form the thick gold layer 72 (e.g., $Au(S_2O_3)_2^{3-}+e^{-} \rightarrow Au+2S_2O_3^{2-}$).

Third Embodiment

Referring to FIG. 7 to FIG. 11, a third embodiment of the present disclosure, which is similar to the first and second embodiments of the present disclosure, is provided. For the sake of brevity, descriptions of the same components in the first to third embodiments of the present disclosure will be omitted herein, and the following description only discloses different features among the first to third embodiments.

In the present embodiment, the manufacturing method S200 sequentially includes (or implements) a sputtering step S210, an electroplating step S220, a covering step S230, a patterning step S240, a first electroless plating step S250, and a second electroless plating step S260. The above steps S210-S260 of the manufacturing method S200 are sequentially described in the following description and can be implemented to form the power component submount 100, but the present disclosure is not limited thereto.

For example, in other embodiments of the present disclosure not shown in the drawings, the above steps S210-S260 of the manufacturing method S200 can be added, omitted, or adjusted according to design requirements (e.g., the second electroless plating step S260 can be omitted); or, the power component submount 100 can be provided by implementing methods other than the manufacturing method S200.

Figure 7:
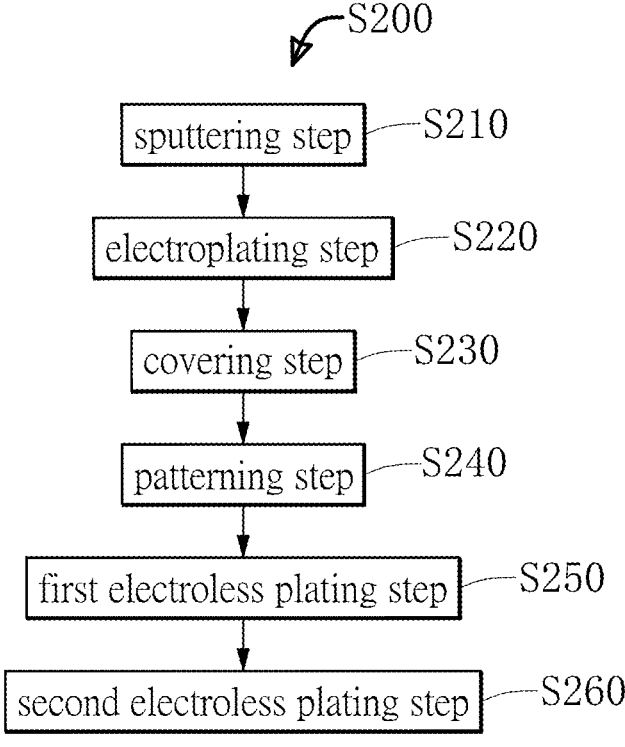
FIG. 7 is a flowchart of the manufacturing method of the power component submount according to a third embodiment of the present disclosure.
Figure 8:
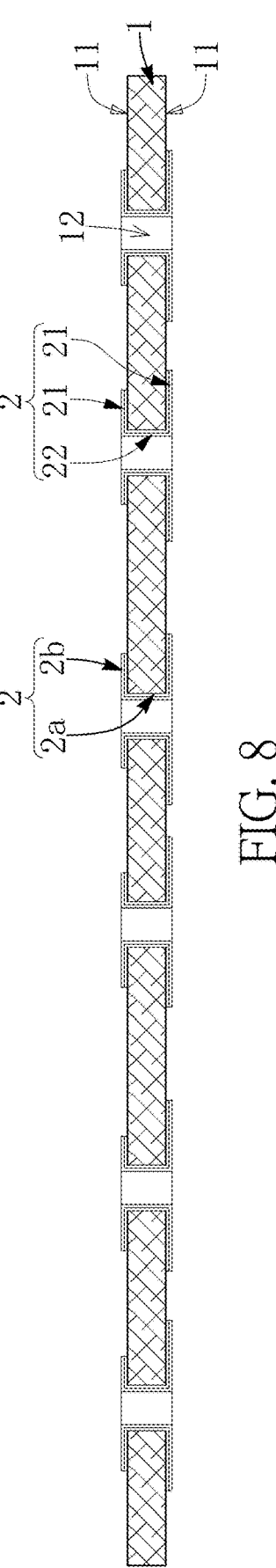
FIG. 8 is a schematic view showing a sputtering step of FIG. 7.

As shown in FIG. 7 and FIG. 8, the sputtering step S210 is implemented by sputtering two board surfaces 11 of a ceramic substrate 1 to form a plurality of electroplating portions 21. In the present embodiment, the ceramic substrate 1 has a plurality of thru-holes 12 penetrating through the two board surfaces 11 (or penetrating therethrough). Moreover, in the sputtering step S120, each of the thru-holes 12 is sputtered to form an extension portion 22 that has a tubular shape and that is connected to two of the electroplating portions 21 respectively arranged on the two board surfaces 11.

Figure 9:
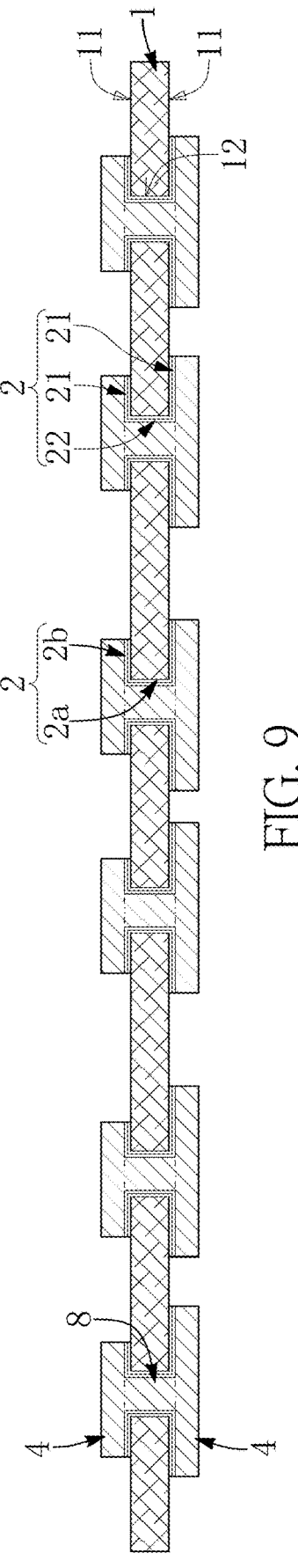
FIG. 9 is a schematic view showing an electroplating step of FIG. 7.

As shown in FIG. 7 and FIG. 9, the electroplating step S220 is implemented by electroplating the electroplating portions 21 to form a plurality of conductive blocks 4 on the electroplating portions 21, respectively. Specifically, in the electroplating step S220, the extension portion 22 in each of the thru-holes 12 is electroplated to form a conductive pillar 8 that is connected to two of the conductive blocks 4 respectively arranged on the two board surfaces 11.

Figure 10:
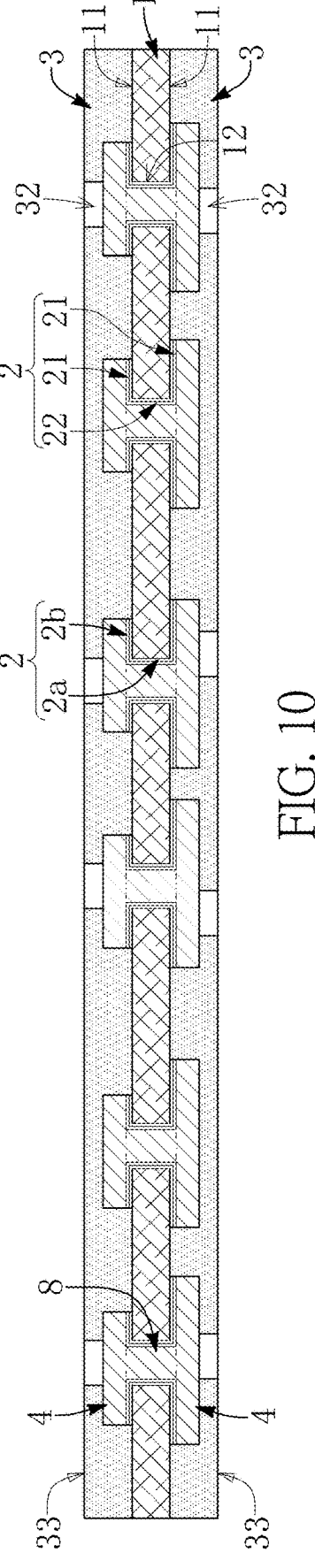
FIG. 10 is a schematic view showing a covering step and a patterning step of FIG. 7.

As shown in FIG. 7 and FIG. 10, the covering step S230 is implemented by forming two insulating layers 3 on the two board surfaces 11 of the ceramic substrate 1, respectively. Specifically, the conductive blocks 4 are embedded in the two insulating layers 3, and each of the two insulating layers 3 can be a polyimide (PI) thin film, but the present disclosure is not limited thereto.

As shown in FIG. 7 and FIG. 10, the patterning step S240 is implemented by forming a plurality of electroless plating slots 32 in the two insulating layers 3. Specifically, each of the electroless plating slots 32 is formed to enable one of the conductive blocks 4 to be exposed therefrom. Moreover, a quantity of the electroless plating slots 32 in the present embodiment is less than a quantity of the conductive blocks 4, so that at least one of the conductive blocks 4 is entirely embedded in the two insulating layers 3 and is not exposed from the electroless plating slots 32.

Figure 11:
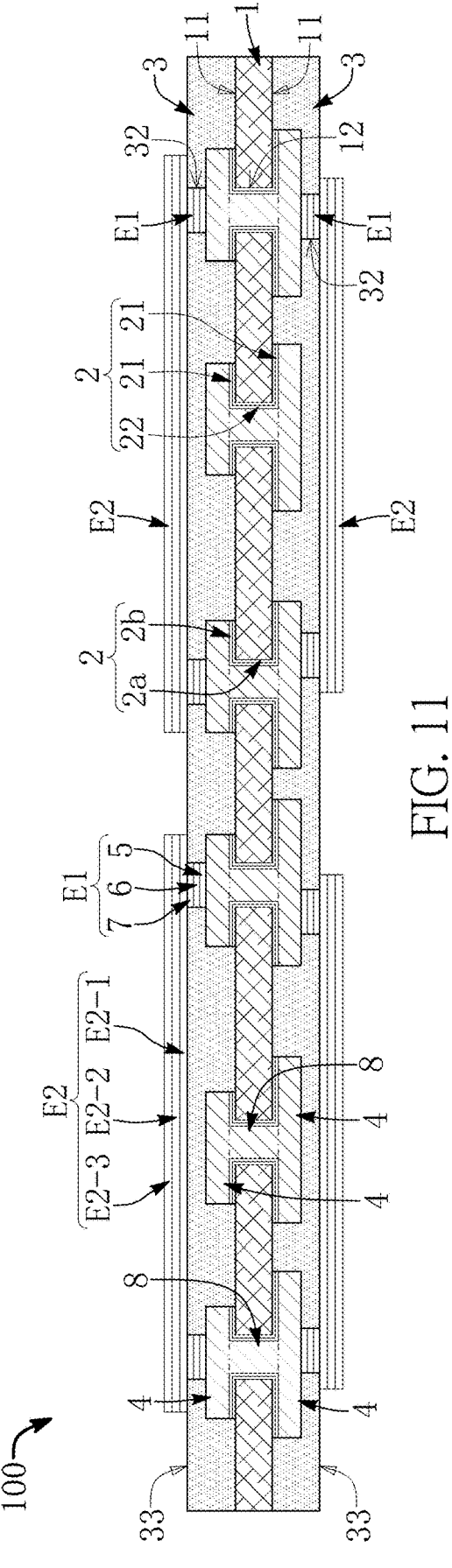
FIG. 11 is a schematic view showing a first electroless plating step and a second electroless plating step of FIG. 7.

As shown in FIG. 7 and FIG. 11, the first electroless plating step S250 is implemented by performing an electroless plating process on the electroless plating slots 32 to form a plurality of first electroless plating conductors E1 in the electroless plating slots 32, respectively. Each of the first electroless plating conductors E1 includes a first electroless plating layer 5 connected to a corresponding one of the conductive blocks 4, a second electroless plating layer 6 connected to (and stacked on) the first electroless plating layer 5, and a third electroless plating layer 7 that is connected to (and stacked on) the second electroless plating layer 6. The third electroless plating layer 7 in each of the electroless plating slots 32 is preferably coplanar with an outer surface 33 of a corresponding one of the two insulating layers 3, but the present disclosure is not limited thereto.

Moreover, in each of the first electroless plating conductors E1, the first electroless plating layer 5 is made of gold (Au) or nickel (Ni), the second electroless plating layer 6 is made of palladium (Pd), and the third electroless plating layer 7 is made of gold (Au). It should be noted that the electroless plating process (e.g., forming process and parameters of the first electroless plating layer 5, the second electroless plating layer 6, and the third electroless plating layer 7) in the present embodiment can be substantially identical to that of the first embodiment or the second embodiment, but the present disclosure is not limited thereto.

In summary, the first electroless conductors E1 in the present embodiment are manufactured by implementing the first electroless plating step S250 of the manufacturing method S200, so that the first electroless conductors E1 can be independently formed without using any tie bar, thereby effectively preventing the power component submount 100 from generating any burr.

The second electroless plating step S260 is implemented by performing the electroless plating process on the outer surface 33 of each of the two insulating layers 3 to form at least one second electroless plating conductor E2 that is connected to at least two of the first electroless plating conductors E1. In the present embodiment, a quantity of the at least one second electroless plating conductor E2 formed on each of the two insulating layers 3 is more than one, and each of the second electroless plating conductors E2 preferably has a sheet-like shape and is connected to the outer surface 33 of a corresponding one of the two insulating layers 3.

Moreover, each of the second electroless plating conductors E2 is a multi-layer structure that is similar to the first electroless plating conductor E1. Specifically, each of the second electroless plating conductors E2 includes three electroless plating layers E2-1, E2-2, E2-3 sequentially stacked on the corresponding insulating layer 3. One of the three electroless plating layers E2-1 connected to the corresponding insulating layer 3 and the at least two of the first electroless plating conductors E1 is made of gold (Au) or nickel (Ni), another one of the three electroless plating layers E2-3 arranged away from the ceramic substrate 1 is made of gold (Au) and is configured to provide for a power component (e.g., a laser emitter not shown in the drawings) to be assembled thereon, and the other one of the three electroless plating layers E2-2 arranged at a middle position is made of palladium (Pd).

In other words, the forming process and parameters of the three electroless plating layers E2-1, E2-2, E2-3 of each of the second electroless plating conductors E2 provided by the present embodiment can be substantially identical to that of the first electroless plating layer 5, the second electroless plating layer 6, and the third electroless plating layer 7 in the first embodiment or the second embodiment, and will be omitted therein for the sake of brevity.

It should be noted that the second electroless plating step S260 can be selectively implemented according to practical requirements. The second electroless conductors E2 in the present embodiment are manufactured by implementing the second electroless plating step S260 of the manufacturing method S200, so that the second electroless conductors E2 can be independently formed without using any tie bar, thereby effectively preventing the power component submount 100 from generating any burr.

In summary, the above description describes a preferable implementation of the manufacturing method S200, and the following description substantially describes the power component submount 100 prepared by implementing the manufacturing method S200. In other words, features of the power component submount 100 can be referred to in the manufacturing method S200 described in the above description, but the present disclosure is not limited thereto.

As shown in FIG. 11, the power component submount 100 in the present embodiment includes a ceramic substrate 1, a sputtering layer 2 formed on the ceramic substrate 1, a plurality of the conductive blocks 4 formed on the sputtering layer 2, a plurality of conductive pillars 8 formed on the sputtering layer 2, two insulating layers 3 respectively formed on two opposite sides of the ceramic substrate 1, a plurality of first electroless plating conductors E1 connected to the conductive blocks 4, and a plurality of second electroless plating conductors E2 that are connected to the first electroless plating conductors E1, but the present disclosure is not limited thereto. For example, in other embodiments of the present disclosure not shown in the drawings, a quantity of the second electroless plating conductors E2 in the power component submount 100 can be at least one.

In the present embodiment, the ceramic substrate 1 has two board surfaces 11 respectively arranged on two opposite sides thereof and a plurality of thru-holes 12 that penetrate through the two board surfaces 11 (or penetrate therethrough). The sputtering layer 2 includes a plurality of electroplating portions 21 respectively formed on the two board surfaces 11 and a plurality of extension portions 22 that are respectively arranged in the thru-holes 12. Each of the extension portions 22 has a tubular shape and is formed on an inner wall of the corresponding thru-hole 12, and two ends of each of the extension portions 22 are respectively connected to two of the electroplating portions 21 respectively arranged on the two board surfaces 11.

The conductive blocks 4 are respectively formed on the electroplating portions 21, the conductive pillars 8 are respectively arranged in the extension portions 22, and two ends of each of the conductive pillars 8 are respectively connected to two of the conductive blocks 4 respectively arranged on the two board surfaces 11. It should be noted that the sputtering layer 2 in the present embodiment includes a Ti-sputtering layer 2a connected to the ceramic substrate 1 and a Cu-sputtering layer 2b that covers the Ti-sputtering layer 2a, but the present disclosure is not limited thereto.

The two insulating layers 3 are respectively formed on the two board surfaces 11 of the ceramic substrate 1, and the conductive blocks 4 are embedded in the two insulating layers 3. The two insulating layers 3 have a plurality of electroless plating slots 32 recessed in two outer surfaces 33 thereof arranged away from each other, and each of the electroless plating slots 32 is formed to enable one of the conductive blocks 4 to be exposed therefrom.

The first electroless plating conductors E1 are respectively formed in the electroless plating slots 32, and each of the first electroless plating conductors E1 is connected to (or formed on) one of the conductive blocks 4. Each of the first electroless plating conductors E1 includes a first electroless plating layer 5 connected to a corresponding one of the conductive blocks 4, a second electroless plating layer 5 connected to the first electroless plating layer 4, and a third electroless plating layer 7 that is connected to the second electroless plating layer 6.

Moreover, the third electroless plating layer 7 in each of the electroless plating slots 32 is coplanar with the outer surface 33 of a corresponding one of the two insulating layers 3. In addition, the first electroless plating layer 5 is made of gold (Au) or nickel (Ni), the second electroless plating layer 6 is made of palladium (Pd), and the third electroless plating layer 7 is made of gold (Au).

The second electroless plating conductors E2 are respectively formed on the two outer surfaces 33 of the two insulating layers 3, and each of the second electroless plating conductors E2 is connected to the third electroless plating layers 7 of at least two of the first electroless plating conductors E1. It should be noted that, in other embodiments of the present disclosure not shown in the drawings, the second electroless plating conductors E2 can be omitted, and the first electroless plating conductors E1 are provided for allowing the power component to be mounted thereon.

Beneficial Effects of the Embodiments

In conclusion, the power component submount and the manufacturing method thereof in the present disclosure are provided with the conductive structure that allows the power component to be assembled thereon, and the first electroless plating layer, the second electroless plating layer, and the third electroless plating layer of the conductive structure and the conductive block can be independently formed without using any tie bar, thereby effectively preventing the power component submount from generating any burr.

Moreover, the power component submount and the manufacturing method thereof in the present disclosure are provided with the first electroless conductors, and the first electroless conductors can be independently formed without using any tie bar, thereby effectively preventing the power component submount from generating any burr.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power component submount, comprising:
   a ceramic substrate having two board surfaces respectively arranged on two opposite sides thereof;
   a sputtering layer including a plurality of electroplating portions respectively formed on the two board surfaces of the ceramic substrate;
   a plurality of conductive blocks respectively formed on the electroplating portions;
   two insulting layers respectively formed on the two board surfaces of the ceramic substrate, wherein the conductive blocks are embedded in the two insulating layers, and wherein the two insulating layers have a plurality of electroless plating slots, and each of the electroless plating slots is formed to enable one of the conductive blocks to be exposed therefrom;
   a plurality of first electroless plating conductors respectively formed in the electroless plating slots, and each of the first electroless plating conductors includes:
      a first electroless plating layer connected to a corresponding one of the conductive blocks and being made of gold (Au) or nickel (Ni);

a second electroless plating layer connected to the first electroless plating layer and being made of palladium (Pd); and
      a third electroless plating layer connected to the second electroless plating layer and being made of gold (Au); and
   a plurality of second electroless plating conductors respectively formed on the outer surfaces of the two insulating layers, wherein each of the second electroless plating conductors is connected to at least two of the first electroless plating conductors.

2. The power component submount according to claim 1, wherein the third electroless plating layer in each of the electroless plating slots is coplanar with an outer surface of a corresponding one of the two insulating layers.

3. The power component submount according to claim 1, wherein the ceramic substrate has a plurality of thru-holes penetrating through the two board surfaces, the sputtering layer includes a plurality of extension portions respectively arranged in the thru-holes, and each of the extension portions has a tubular shape and is connected to two of the electroplating portions respectively arranged on the two board surfaces, and wherein the power component submount includes a plurality of conductive pillars respectively arranged in the extension portions, and each of the conductive pillars is connected to two of the conductive blocks respectively arranged on the two board surfaces.

4. A manufacturing method for manufacturing the power component submount according to claim 1, comprising:
   a sputtering step implemented by sputtering two board surfaces of a ceramic substrate to form a plurality of electroplating portions;
   an electroplating step implemented by electroplating the electroplating portions to form a plurality of conductive blocks on the electroplating portions, respectively;
   a covering step implemented by forming two insulating layers on the two board surfaces of the ceramic substrate, respectively, wherein the conductive blocks are embedded in the two insulating layers;
   a patterning step implemented by forming a plurality of electroless plating slots in the two insulating layers, wherein each of the electroless plating slots is formed to enable one of the conductive blocks to be exposed therefrom;
   a first electroless plating step implemented by performing an electroless plating process on the electroless plating slots to form a plurality of first electroless plating conductors in the electroless plating slots, respectively, wherein each of the first electroless plating conductors includes:
      a first electroless plating layer connected to a corresponding one of the conductive blocks;
      a second electroless plating layer connected to the first electroless plating layer; and
      a third electroless plating layer connected to the second electroless plating layer; and
   a second electroless plating step implemented by performing an electroless plating process on the outer surface of each of the two insulating layers to form at least one second electroless plating conductor that is connected to at least two of the first electroless plating conductors;
   wherein, in each of the first electroless plating conductors, the first electroless plating layer is made of gold (Au) or nickel (Ni), the second electroless plating layer is made of palladium (Pd), and the third electroless plating layer is made of gold (Au).

5. The manufacturing method according to claim 4, wherein the third electroless plating layer in each of the electroless plating slots is coplanar with an outer surface of a corresponding one of the two insulating layers.

6. The manufacturing method according to claim 4, wherein the ceramic substrate has a plurality of thru-holes penetrating through the two board surfaces, wherein, in the sputtering step, each of the thru-holes is sputtered to form an extension portion that has a tubular shape and that is connected to two of the electroplating portions respectively arranged on the two board surfaces, and wherein, in the electroplating step, the extension portion in each of the thru-holes is electroplated to form a conductive pillar that is connected to two of the conductive blocks respectively arranged on the two board surfaces.

* * * * *